United States Patent
Wood et al.

(10) Patent No.: US 7,345,603 B1
(45) Date of Patent: Mar. 18, 2008

(54) METHOD AND APPARATUS FOR COMPRESSED SENSING USING ANALOG PROJECTION

(75) Inventors: Mark L. Wood, Garland, TX (US); Chen-Chu Alex Yeh, Greenville, TX (US); Gerald Lothair Fudge, Rockwall, TX (US)

(73) Assignee: L3 Communications Integrated Systems, L.P., Greenville, TX (US)

( * ) Notice: Subject to any disclaimer, the term of this patent is extended or adjusted under 35 U.S.C. 154(b) by 0 days.

(21) Appl. No.: 11/557,164

(22) Filed: Nov. 7, 2006

(51) Int. Cl.
*H03M 1/00* (2006.01)

(52) U.S. Cl. .................. 341/122; 341/123; 341/155

(58) Field of Classification Search .............. 341/122, 341/123, 155
See application file for complete search history.

(56) References Cited

U.S. PATENT DOCUMENTS

| | | | | |
|---|---|---|---|---|
| 5,170,359 | A  * | 12/1992 | Sax et al. | 702/73 |
| 5,239,299 | A  * | 8/1993 | Apple et al. | 341/118 |
| 5,978,742 | A  * | 11/1999 | Pickerd | 702/66 |
| 6,369,737 | B1 * | 4/2002 | Yang et al. | 341/155 |
| 6,567,030 | B1 | 5/2003 | Pupalaikis | 341/155 |
| 6,567,567 | B1 * | 5/2003 | Levin et al. | 382/284 |
| 6,819,279 | B2 * | 11/2004 | Pupalaikis | 341/155 |
| 2002/0130799 | A1 * | 9/2002 | Yang et al. | 341/138 |
| 2005/0046584 | A1 * | 3/2005 | Breed | 340/825.72 |
| 2006/0029279 | A1 | 2/2006 | Donoho | |
| 2006/0038705 | A1 * | 2/2006 | Brady et al. | 341/13 |
| 2007/0027656 | A1 * | 2/2007 | Baraniuk et al. | 702/189 |

OTHER PUBLICATIONS

U.S. Appl. No. 11/465,826, filed Aug. 21, 2006, Fudge.

Stable Signal Recovery from Incomplete and Inaccurate Measurements: Emmanuel Candes, Justin Romberg, and Terence Tao; Applied & Computational Mathematics, Caltech, Pasadena, CA; Feb. 2005, Revised Jun. 2005.

Near Optimal Signal Recovery from Random Projections: Universal Encoding Strategies; Emmanuel Candes & Terence Tao: Applied & Computational Mathematics, Caltech, Pasadena, CA; Oct. 2004.

Compressed Sensing: David Donoho, IEEE Transactions on Information Theory, vol. 52, No. 4, Apr. 2006.

Sparse Signal Detection from Incoherent Projections; Marco Duarte, Mark Davenport, Michael Wakin & Richard Baraniuk; Rice University; ICASSP, May 2006.

Distributed Compressed Sensing of Jointly Sparse Signals; Marco Duarte, Shriram Sarvotham, Dror Baron, Michael Wakin & Richard Baraniuk; Rice University; 2005.

(Continued)

*Primary Examiner*—Linh Nguyen
(74) *Attorney, Agent, or Firm*—Hovey Williams LLP

(57) ABSTRACT

Embodiments of the present invention provide a method and apparatus for compressed sensing. In some embodiments, the apparatus (10) generally includes a receiving element (12) operable to receive an input signal, an integrate/dump circuit (14), a sampling element (16), and a processor (18). The integrate/dump circuit (14) is operable to integrate at least a portion of the received signal to provide an integrated signal and the sampling element (16) is operable to sample the integrated signal at a first sampling rate which is less than the Nyquist rate for the input signal. The processor (18) is operable to form a compressed sensing matrix utilizing a first set of time indices corresponding to the first sampling rate, form a measurement vector utilizing at least a portion of the sampled signal, and reconstruct at least a portion of the input signal utilizing the compressed sensing matrix and the measurement vector.

17 Claims, 4 Drawing Sheets

OTHER PUBLICATIONS

Fast Reconstruction in Compressed Sensing; Marco Duarte; Rice University; Spring 2005.

Near-Optimal Sparse Fourier Representations via Sampling; A. Gilbert, S. Guha, P. Indyk, S. Muthukrishnan & M. Strauss; Montreal, Quebec, Canada, May 2002.

Applications of Sparse Approximation in Communications; A. Gilbert; J. Tropp; University of Michigan, 2005.

Minimum Rate Sampling & Reconstruction of Signals with Arbitrary Frequency Support; Cormac Herley, Ping Wah Wong; IEEE Transactions on Information theory, vol. 45, No. 5, Jul. 1999.

Ambiguities in the Harmonic Retrieval Problem using Non-Uniform Sampling; V. Lefkaditis & A. Manikas; IEEE Proceedings online No. 20010619; 2001.

Use of the Symmetrical Number System in Resolving Single-Frequency Undersampling Allases; Phillip Pace, Richard Leino & David Styer; IEEE 1997.

Reduction of Aliasing Ambiguities Through Phase Relations; R. Sanderson, J Tsui & N. Freese; IEEE Transactions on Aerospace & Electronic Systems, vol. 28, No. 4, Oct. 1992.

A Non-Uniform Sampling Technique for A/D Conversion; N. Saylner, H, Sorensen & T. Viswanathan; IEEE 1993.

Two-Channel RSNS Dynamic Range; D. Styer & P. Pace; IEEE 2002.

Simultaneous Sparse Approximation via Greedy Pursuit; J. Tropp, A. Gilbert & M. Strauss; IEEE 2005.

Extensions of Compressed Sensing; Yaakov Tsaig; David Donoho; Oct. 22, 2004.

An Efficient Frequency-Determination Algorithm from Multiple Undersampled Waveforms; Xiang-Gen Xia; IEEE 2000.

Robust Uncertainty Principles: Exact Signal Reconstruction from Highly Incomplete Frequency Information by: Emmanuel Candes, Justin Romberg & Terence Tao; Jun. 2004, Rev: Aug. 2005; Los Angeles, CA.

Joint Sparsity Models for Distributed Compressed Sensing, by; Marco F. Duarte, Shriram Sarvotham, Michael B. Wakin, Dror Baron, & Richard G. Baraniuk; Rice University, no date.

Practical Signal Recovery from Random Projections, by: Emmanuel Candes & Justin Romberg; draft: Jan. 25, 2005.

Random Filters for Compressive Sampling and Reconstruction, by: Joel a. Tropp, Michael B. Wakin, Marco F. Duarte, Dror Baron & Richard G. Baraniuk; ICASSP, May 2006.

Signal Reconstruction from Noisy Random Projections, by: Jarvis Haupt & Robert Nowak; Dept of Electrical & Computer Engineering, University of Wisconsin-Madison, Mar. 2005.

Signal Recovery from Partial Information via Orthogonal Matching Pursuit, by: Joel A. Tropp & Anna C. Gilbert; University of Michigan; Apr. 2005.

Sampling Signals with Finite Rate of Innovation, by: Martin Vetterli, Pina Marziliano & Thierry Blu; IEEE Transactions on Signal Processing, vol. 50, No. 6, Jun. 2002.

* cited by examiner

METHOD AND APPARATUS FOR COMPRESSED SENSING USING ANALOG PROJECTION

BACKGROUND OF THE INVENTION

1. Field of the Invention

The present invention relates to reconstruction of sampled signals. More particularly, the invention relates to a method and apparatus for compressed sensing that utilizes analog projection to at least partially reconstruct an input signal.

2. Description of the Related Art

Sampling is a method of converting an analog signal into a numeric sequence. Analog signals are often sampled at spaced time intervals to form digital representations for storage, analysis, processing, or other uses. Typically an analog signal must be sampled at or above its Nyquist rate, which may be defined as twice the bandwidth of the analog signal or twice the highest frequency component of the analog signal in the case of baseband sampling. For wide bandwidth signals, sampling at the Nyquist rate requires a great amount of computing resources, processing power, and data storage. Furthermore, if the sampled data is to be transmitted to a secondary location, a large amount of bandwidth is required as well.

It is known, however, that if the signal to be sampled is sparse or compressible, i.e. there is a relatively small amount of data contained within limited components of the signal (expressed in time domain, frequency domain, and/or other transform domain), then sampling at the Nyquist rate is an inefficient use of resources. In the case of sparse or compressible signals, a recently developed method of sampling known as compressed sensing provides a theoretical basis for sampling at less than the Nyquist rate with either no or minimal information loss so that the compressed samples may be reconstructed as an accurate full-bandwidth representation or estimate of the original signals.

Unfortunately, known compressed sensing methods suffer from several limitations. For example, most compressed sensing methods are unable to sample a signal at less than its Nyquist rate and then effectively reconstruct the signal by sampling only in the time domain.

SUMMARY OF THE INVENTION

The present invention solves the above-described problems and provides a distinct advance in the art of signal sampling and reconstruction. More particularly, the invention provides a method and apparatus for compressed sensing that utilizes analog projection to at least partially reconstruct an input signal. Thus, embodiments of the present invention enable an input signal to be sampled at less than the Nyquist rate and at least partially reconstructed.

In one embodiment, the present invention provides an apparatus for reconstructing an input signal which generally includes a receiving element operable to receive the input signal, an integrate/dump circuit, a sampling element, and a processor. The integrate/dump circuit is operable to integrate at least a portion of the received signal to provide an integrated signal. The sampling element is operable to sample the integrated signal at a first sampling rate which is less than the Nyquist rate for the input signal. The processor is operable to form a compressed sensing matrix utilizing a first set of time indices corresponding to the first sampling rate, form a measurement vector utilizing at least a portion of the sampled signal, and reconstruct at least a portion of the input signal utilizing the compressed sensing matrix and the measurement vector.

In another embodiment, the apparatus generally includes a receiving element operable to receive the input signal, first and second integrate/dump circuits, a delay element, first and second sampling elements, and a processor. The first integrate/dump circuit is operable to integrate at least a portion of the received signal to provide a first integrated signal. The delay element is operable to delay the received input signal and the second integrate/dump circuit is operable to integrate a least a portion of the delayed signal to provide a second integrated signal. The first sampling element is operable to sample the first integrated signal and the second sampling element is operable to sample the second integrated signal. The processor is operable to form a compressed sensing matrix utilizing a first set of time indices corresponding to the first sampling rate, form a measurement vector utilizing at least a portion of the sampled signals, and reconstruct at least a portion of the input signal utilizing the compressed sensing matrix and the measurement vector.

In another embodiment, the present invention provides a method for reconstructing an input signal. The method generally includes receiving the input signal, integrating at least a portion of the received input signal and dumping the integrated portion of the received signal, sampling the integrated signal at a first sampling rate less than the Nyquist rate for the input signal, forming a compressed sensing matrix utilizing a first set of time indices corresponding to the first sampling rate, forming a measurement vector utilizing at least a portion of the sampled signal; and reconstructing at least a portion of the input signal utilizing the compressed sensing matrix and the measurement vector.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein.

Figure 1:
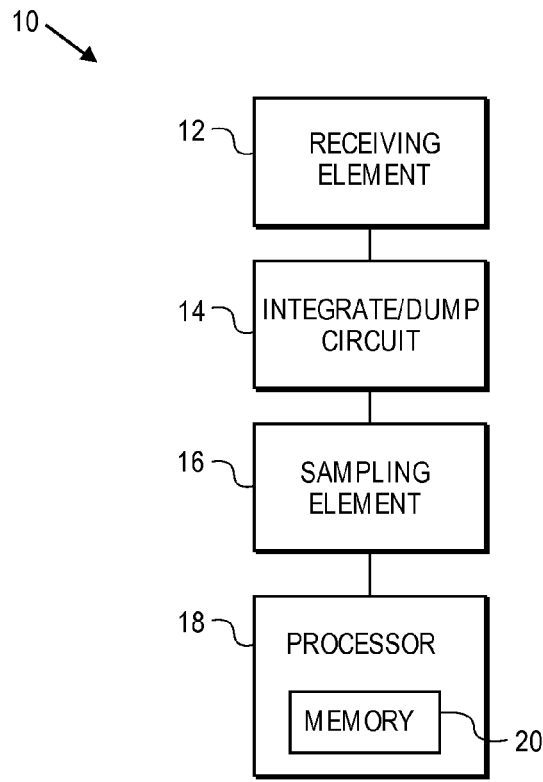
FIG. 1 is a block diagram showing some of the elements operable to be utilized by various embodiments of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

The present invention can be implemented in hardware, software, firmware, or combinations thereof. In some embodiments, however, the invention is implemented with a computer program. The computer program and equipment described herein are merely examples of a program and equipment that may be used to implement the present invention and may be replaced with other software and computer equipment without departing from the scope of the present teachings. It will also be appreciated that the principles of the present invention are useful independent of a particular implementation, and that one or more of the steps described herein may be implemented without the assistance of any particular hardware.

Methods consistent with the present teachings are especially well-suited for implementation by an apparatus 10 as illustrated in FIGS. 1-5. The apparatus 10 generally includes a receiving element 12 operable to receive an input signal, at least one integrate/dump circuit 14 coupled with the receiving element 12, a sampling element 16 coupled with the integrate/dump circuit 14, and a processor 18 and memory 20 coupled with the sampling element 16 and operable to process signals. However, the particular apparatus 10 and its components 12, 14, 16, 18, 20 can be modified and/or replaced with similar components without departing from the scope of the present invention.

The receiving element 12 may include any element or combination of elements operable to receive an input signal or a representation of the input signal. Preferably, the receiving element 12 is operable to receive an emitted electromagnetic signal or a representation thereof. Thus, the receiving element 12 may include any conventional antenna or electrical elements operable to acquire, detect, relay, store a signal, etc.

In various embodiments the receiving element 12 comprises a data connection, such as a wired or wireless network connection or element, to enable the apparatus 10 to receive data corresponding to the input signal through a network and/or from another electronic device. Thus, the receiving element 12 need not directly receive or detect the input signal.

The integrate/dump circuit 14 may comprise any element or elements operable to integrate at least a portion of a signal to provide an integrated signal and dump the integrated portion of the received signal. The integrate/dump circuit 14 may comprise analog and digital devices, including but not limited to, capacitors, resistors, switches, latches, transistors, operational amplifiers, discrete and integrated circuit components, combinations thereof, etc.

Preferably, the integrate/dump circuit 14 is synchronous such that it may integrate and dump a signal according to a received clock signal. As is discussed below in more detail, the integrate/dump circuit 14 and sampling element 16 both are preferably functioned according to the same clock signal. In embodiments where the integrate/dump circuit 14 is synchronous, the integrate/dump circuit 14 is operable to be dumped according to the received clock signal such that provided integrated signal represents an integration of the received signal over a period generally defined by the inverse of the frequency of the received clock signal. Thus, the integrate/dump circuit 14 is operable to repeatedly integrate and dump signals.

Figure 4:
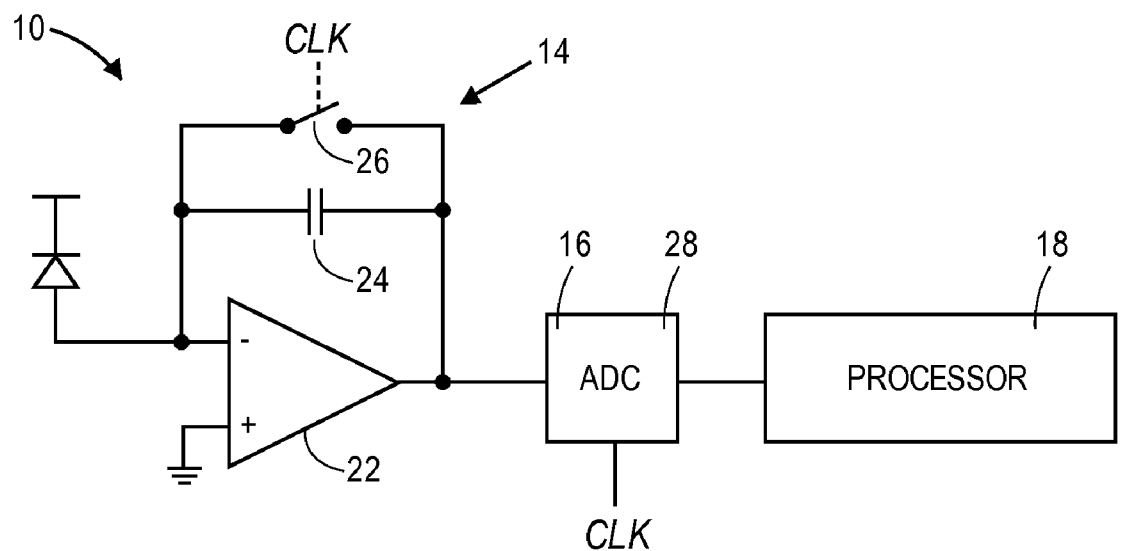
FIG. 4 is another block diagram showing some of the elements of FIG. 1 in more detail.
Figure 5:
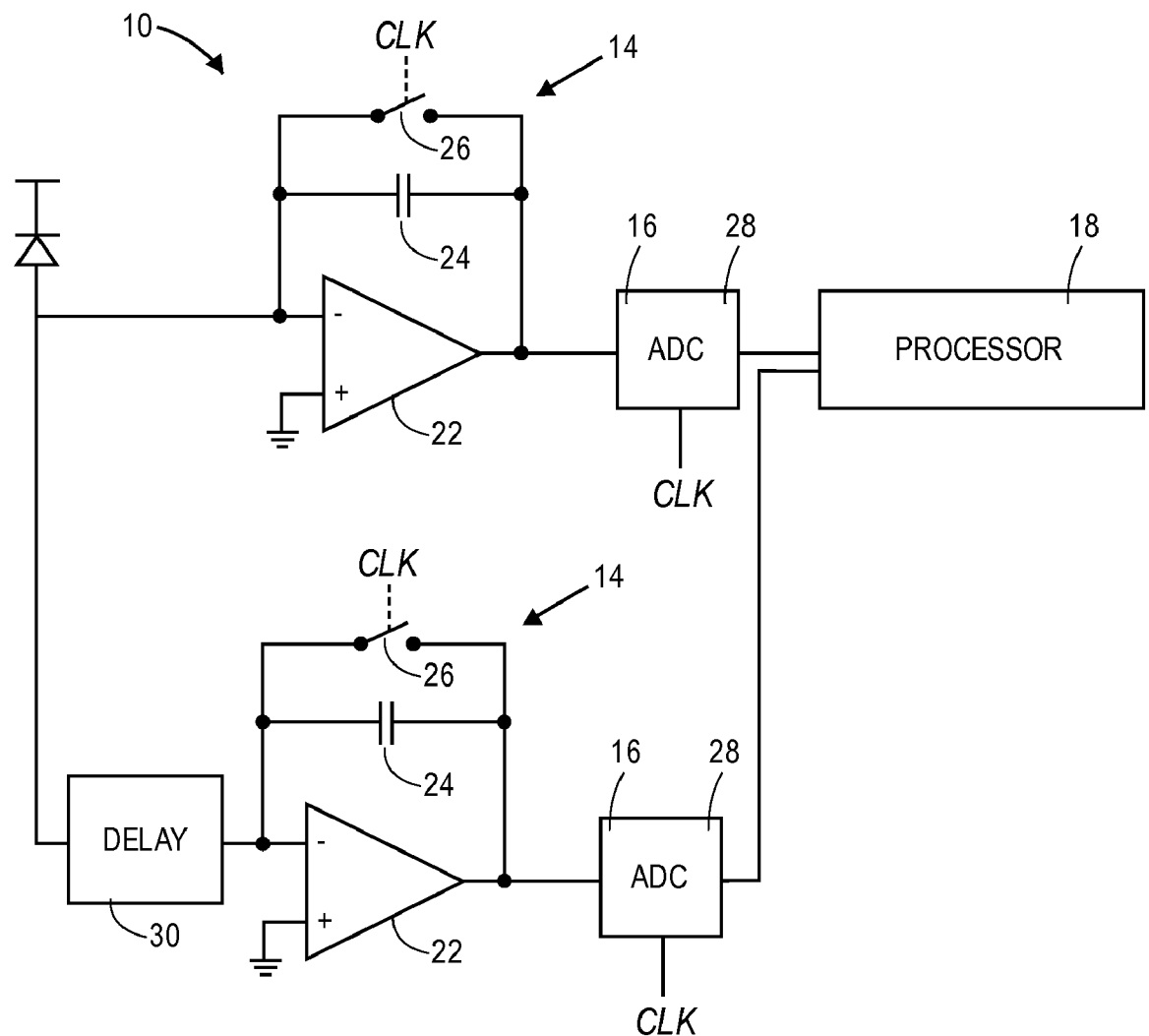
FIG. 5 is another block diagram showing some of the elements of FIG. 2 in more detail.

In preferred embodiments, and as shown in FIGS. 4-5, the integrate/dump circuit 14 is a combination of analog devices that include an operational amplifier 22, a capacitor 24, and a synchronous switch 26. The capacitor 24 and switch 26 are positioned in parallel between the negative input and the output of the operational amplifier 22. The switch 26, when open, allows the integration of a received signal, and when closed, dumps the received signal by reducing or eliminating the charge stored by the capacitor 24. The capacitor 24 may be selected to provide a desired integration period using techniques well-known in the art. In some embodiments, the capacitor 24 may have a variable capacitance to enable dynamic reconfiguration of the integrate/dump circuit 14 and/or the capacitor 24 may include a plurality of discrete elements, such as capacitors, resistors, and inductors, arranged in parallel or serial configurations, to provide any desired capacitance or inductance.

As should be appreciated by those skilled in the art, innumerable configurations of the integrate/dump circuit 14 may be employed by the present invention, including prior art configurations, that are operable to perform the integrate and dump functions described herein. Further, in various embodiments, as discussed in more detail below, the apparatus 10 may comprise a plurality of integrate/dump circuits each configured in a substantially similar manner to the integrate/dump circuit 14 discussed above.

Use of the integrate/dump circuit 14 allows analog projection of the input signal, and the preservation of vital signal features, prior to the potentially lossy sampling by the sampling element 16. Utilization of the integrate/dump circuit 14 for analog projection also reduces the effective number of bits (ENOB) required for the sampling element 16 and improves signal preservation and reconstruction performance, as discussed below. Thus, use of the integrate/dump circuit 14 reduces the sampling rate required to effectively reconstruct the input signal.

The sampling element 16 is preferably coupled with the integrate/dump circuit 14 to receive and sample integrated signals. The sampling element 16 is operable to sample the integrated signals utilizing one or more sampling clock signals. Preferably, the sampling element 16 utilizes the same clock signal as the integrate/dump circuit 14 to sample signals. Thus, the integrate/dump circuit 14 and the sampling element 16 dump and sample during the same general time period.

The sampling element 16, and/or the integrate/dump circuit 14, are preferably triggered by the same oscillating signal, such as by the rising or falling edge of one or more sampling clock signals. On the rising edge, falling edge, or other portion of the clock signal, the sampling element 16 samples, such as by latching, the signal output by the integrate/dump circuit 14 to provide one or more sampled signals. The sampling element 16 may comprise digital or analog components, such as conventional memory or capturing elements.

Preferably, the sampling element 16 includes at least one analog-to-digital converter (ADC) 28 to sample the integrated signal generated by the integrate/dump circuit 14 and provide a digital representation of the analog integrated signal. In various embodiments, as discussed in more detail below, the apparatus 10 may include a plurality of sampling elements each configured in a similar manner to the sampling element 16 discussed above.

The processor 18 is coupled with at least the sampling element 16 and is operable to process the sampled signal or signals. The processor 18 may include conventional processing and signal processing elements, including computers, computing elements, computing devices, microprocessors, microcontrollers, digital and analog logic elements, application-specific integrated circuits (ASICs), field-programmable gate arrays (FPGAs) or other programmable logic devices, digital signal processors (DSPs), combinations thereof, etc.

Preferably, the processor 18 includes or is otherwise coupled with memory 20. The memory 20 is operable to store data corresponding to apparatus 10 configuration, programs or instructions for functioning the processor 18, the received signal, the integrated signal, the sampled signal or signals, processed signals, etc. The memory 20 may comprise any computer or electrically readable medium, as is discussed in more detail below.

Figure 2:
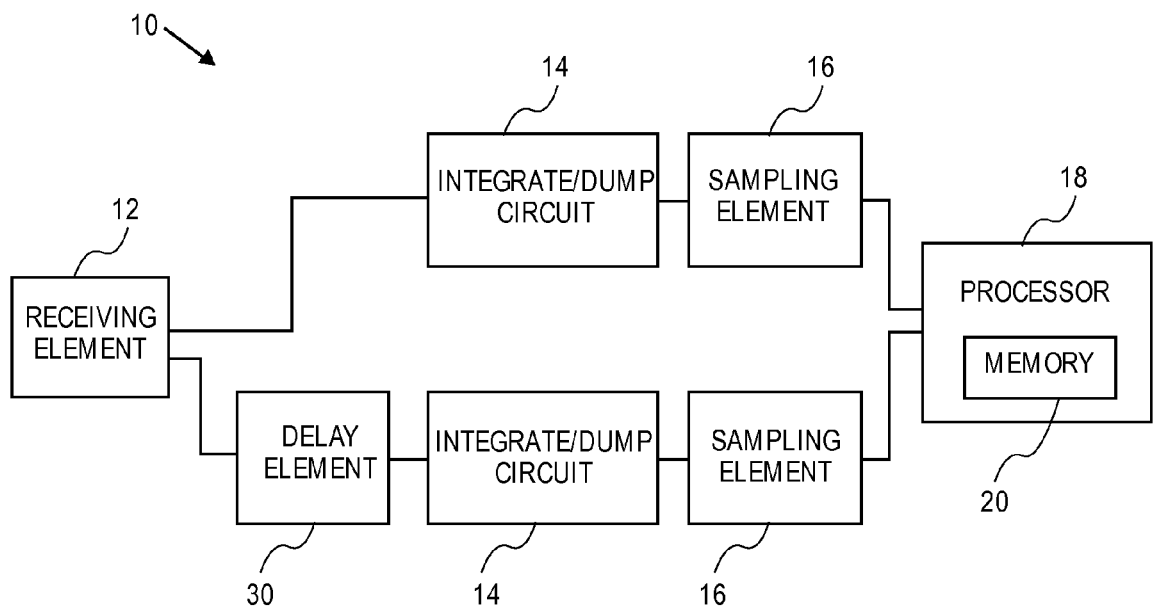
FIG. 2 is another block diagram illustrating an alternative embodiment of the present invention.

In various embodiments, as shown in FIGS. 2 and 5, the apparatus 10 may include a plurality of integrate/dump circuits 14, a plurality of sampling elements 16, and at least one delay element 30. Utilization of a plurality of integrate/dump circuits 14 and a plurality of sampling elements 16, with one sampling element 16 corresponding to the output of each integrate/dump circuit 14, may be desirable in some embodiments as it allows additional and relevant signal information to be acquired without requiring sampling at the Nyquist rate.

The one or more delay elements 30 are preferably coupled with the receiving element 12 and are operable to delay the propagation of received signals. The delay elements 30 may comprise any element or combination of elements operable to delay signal propagation, such as buffers or registers. In some embodiments, the delay elements 30 may comprise varying lengths of conducting material to provide a plurality of varying propagation times.

In some embodiments, the delay elements 30 may be integral with the integrate/dump circuits 14, such where the delay elements 30 form part of the operational amplifiers 22. In such embodiments, the delay elements 30 may be formed by integrating a delay into the operational amplifiers 22 themselves, such as by including buffers therein. However, as should be appreciated by those skilled in the art, the delay elements 30 may comprise any configuration to present any desired amount of propagation delay.

As shown in FIG. 5, in embodiments including the plurality of integrate/dump circuits 14, at least one integrate/dump circuit 14 is coupled to the receiving element 12 without the use of the delay element 30, just as described above. Additionally, at least one other integrate/dump circuit 14 is coupled with the output of the delay element 30 to receive a delayed signal therefrom. Similarly, a plurality of other integrate/dump circuits 14 may be coupled with a plurality of other delay elements 30 to provide additional analog projection paths.

Each integrate/dump circuit 14 functions as discussed above to integrate and dump signals. Due to the use of the delay elements 30, each integrate/dump circuit 14 integrates a different portion of the signal received by the receiving element 12. Consequently, each sampling element 16 samples a different integrated portion of the received signal to broaden the amount of data available to the processor 18 without requiring sampling at the Nyquist rate.

In various embodiments, the processor 18 or its functions can be programmed in a hardware description language (HDL), such as VHDL or Verilog, and implemented in hardware using electronic computer-aided design software tools. In some embodiments, the processor 18 can be implemented in a programmable device such as a DSP or an FPGA. Furthermore, in some embodiments, all elements of the present invention may be implemented in a semi-custom or fully-custom mixed-signal ASIC. Thus, the receiving element 12, the delay element 30, the integrate/dump circuit 14, the sampling element 16, and the processor 18 may be integrated into a single element.

In various embodiments, the apparatus 10 may alternatively or additionally comprise a plurality of computing elements or a network of computing elements such that one or more portions of the invention may be implemented utilizing a first computing element and one or more other portions of the invention may be implemented utilizing a second computing element.

Computer programs consistent with the present teachings can be stored in or on a computer-readable medium residing on or accessible by the apparatus 10, such as the memory 20, for instructing the processor 18 to implement the method of the present invention as described herein. The computer program may comprise an ordered listing of executable instructions, although some parallel architectures that allow for non-ordered listing of instructions are acceptable, for implementing logical functions in the processor 18 and other computing devices coupled with or included within the apparatus 10. The computer program can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions.

The instructions comprising the computer program of the present invention will hereinafter be referred to simply as "the program" or "the computer program." It will be understood by persons of ordinary skill in the art that the program may comprise a single list of executable instructions or two or more separate lists, and may be stored on a single computer-readable medium or multiple distinct media. Further, the instructions may also be implemented in a hardware description language for implementation in a programmable logic device, as discussed above.

In the context of this application, a "computer-readable medium", including the memory 20, can be any means that can contain, store, communicate, propagate or transport the program for use by or in connection with the instruction execution system, apparatus, or device. The computer-readable medium can be, for example, but not limited to, an electronic, magnetic, optical, electro-magnetic, infrared, or semi-conductor system, apparatus, device, or propagation medium. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disc (CD) or a digital video disc (DVD). The computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

In various embodiments, the apparatus 10 may additionally include portions of the apparatus disclosed in commonly-assigned U.S. patent application Ser. No. 11/465,826, filed Aug. 21, 2006, which is incorporated herein by reference. Specifically, the integrate/dump circuit 14 and/or delay element 30 discussed above may be coupled with the wideband filter disclosed by the above-identified application to facilitate time-based compressed sensing.

Figure 6:
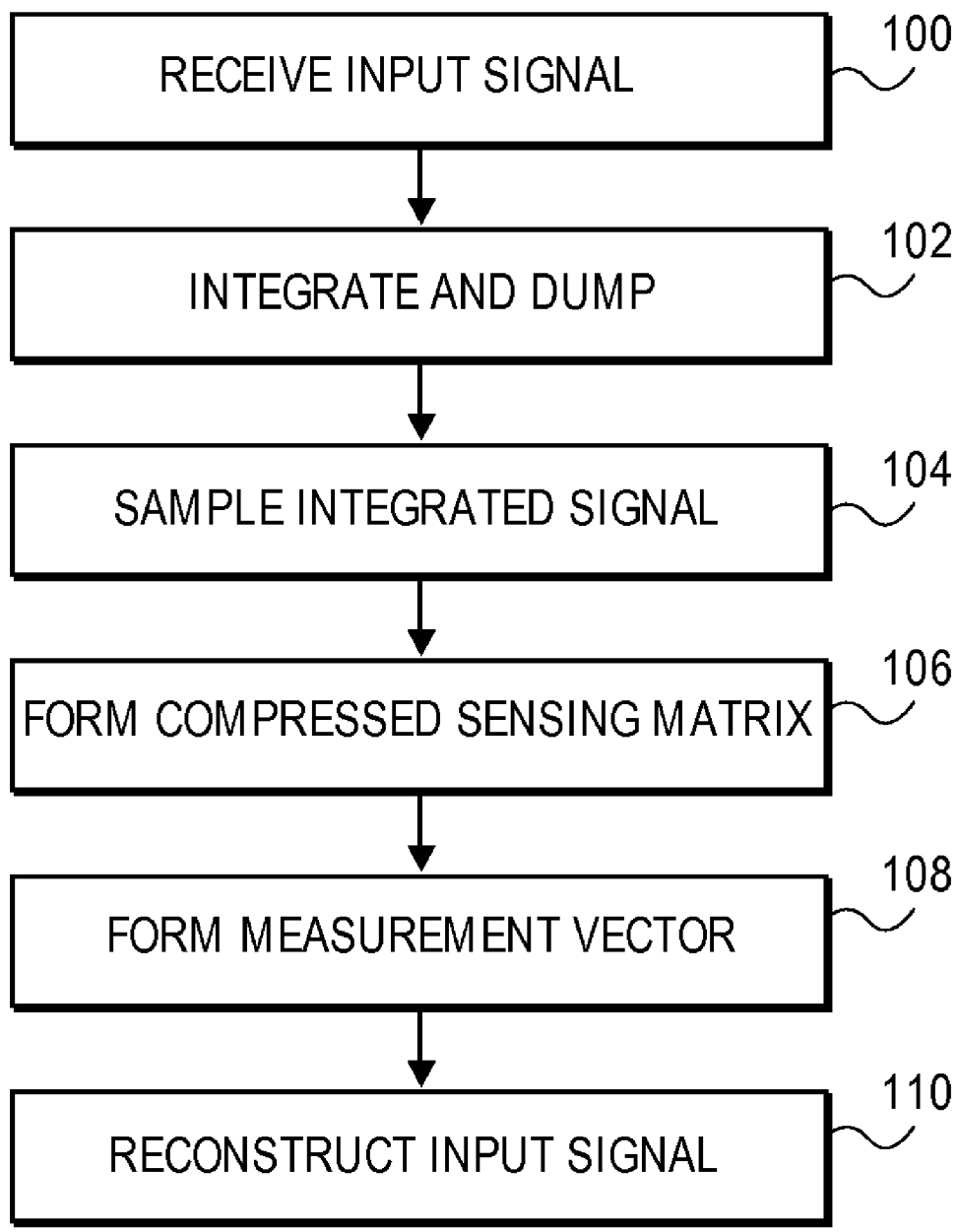
FIG. 6 is a flow chart showing some of the steps operable to be performed by various embodiments of the present invention.

A flowchart of steps that may be utilized by the present invention to perform compressed sensing is illustrated in FIG. 6. Some of the blocks of the flow chart may represent a module segment or portion of code of the computer program of the present invention which comprises one or more executable instructions for implementing the specified logical function or functions. Further, the steps discussed below describe at least some of the functions and operations operable to be performed by the apparatus 10 and its various components.

In step 100, an input signal is received. As discussed above, the input signal is preferably received as an analog signal utilizing the receiving element 12. However, in some embodiments, the input signal may be received by accessing digital data corresponding to a stored input signal and forming an analog representation of the stored digital data.

In step 102, the received input signal is integrated and dumped. As discussed above, the received signal is preferably integrated and dumped utilizing the integrate/dump circuit 14 discussed above. Additionally, in some embodiments, portions of the received signal may be delayed using one or more of the delay elements 30 and be integrated and dumped as described above using the plurality of integrate/dump circuits 14. Further, in some embodiments, the input signal may be integrated by accessing data corresponding to the received signal, including digital data or an analog representation thereof, and integrating signal information represented by the accessed data.

Figure 3:
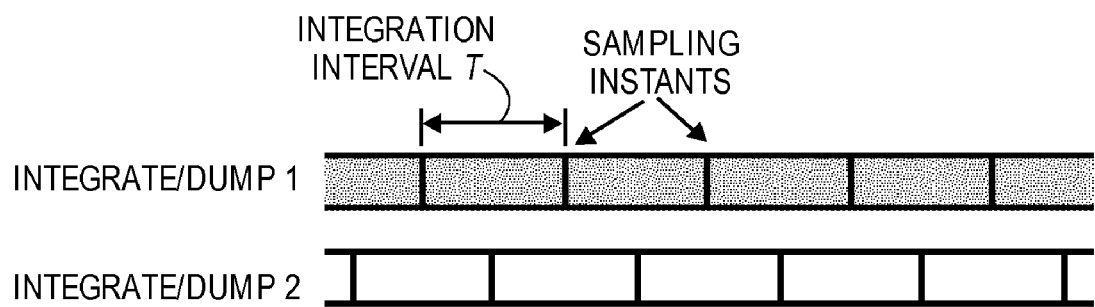
FIG. 3 is a timing diagram for some of the elements illustrated in FIG. 2.

As is also discussed above in detail, the input signal is preferably synchronously integrated and dumped utilizing the clock signal corresponding to a first sampling rate, where the first sampling rate is less than the Nyquist rate for the input signal. Consequently, the received signals are preferably integrated over an integration interval, defined by the period of the received clock signal at the first sampling rate, and dumped at the end of the integration interval. The integration interval for two integrate/dump circuits 14, with one of the integrate/dump circuits 14 being coupled to the delay element 30 as shown in FIG. 2, is shown in FIG. 3.

In step 104, the integrated signal is sampled. Preferably, and as discussed above, the sampling element 16 samples the output of the integrate/dump circuit 14 according to the first sampling rate. Thus, the sampling element 16 preferably samples the integrated signal at, or in proximity to, the end of the integration interval discussed above. Consequently, the data resulting from each sample acquired by the sampling element 16 preferably corresponds to the value of at least a portion of the input signal integrated over the integration interval. Thus, in contrast to systems where analog-to-digital converters directly sample input signals, embodiments of the present invention enable each acquired sample to represent more than a single and finite value of the input signal.

As is also discussed above, in some embodiments a plurality of integrated signals, provided by a plurality of integrate/dump circuits 14, may be sampled with a corresponding plurality of sampling elements 16. In such embodiments, each of the sampling elements 16 preferably samples according to the same clock signal corresponding to the first sampling rate. The specific times at which the integrated signals are sampled at in step 104 are discussed in more detail below in step 108.

In step 106, a compressed sensing matrix φ is formed. As should be appreciated by those skilled in the art, a compressed sensing matrix is a matrix utilized by compressed sensing methods to reconstruct a sparsely sampled input signal, as is discussed at length below. A compressed sensing matrix can also be used to resample and compress a Nyquist-sampled signal. The compressed sensing matrix φ is generally formed utilizing a first set of time indices corresponding to the first sampling rate.

The first set of time indices is preferably embodied by K selected time indices represented by $\{T_{KT}\}$) from the set of N Nyquist time indices given by the Nyquist rate. For example, if the Nyquist rate is 100 samples per unit of time, the set of N Nyquist time samples consists of 100 samples. If the first sampling rate, used by both the integrate/dump circuit 14 and sampling element 16, is one-fifth of N (20 samples per unit of time), then $\{T_{KT}\}$ includes 20 sampling time indices. Each of the K time indices in $\{T_{KT}\}$ may correspond to any one of the 100 indices in the Nyquist sample set. As should be appreciated, the first sampling rate may be embodied by the K time indices through direct identification of the K indices without actually computing the first sampling rate. Consequently, the first set of time indices preferably corresponds to the first sampling rate and falls on a Nyquist rate or faster uniform grid of sample times.

The first compressed sensing matrix is a K×N matrix. K is preferably in the range of 4 L to 6 L with K being significantly less than N. L is the minimum number of coefficients required to capture the important information in the original signal. The actual values of K and N will vary depending upon the actual implementation of the present invention. However, a user, the apparatus 10, and/or the computer program may automatically estimate K and N based upon expected or desired signal reconstruction, signal characteristics, and system capabilities.

The K time indices may be selected based upon an arbitrary or random basis. Consequently, the first sampling rate is not necessarily uniform. For instance, a user, the processor 18, and/or computer program may pseudo-randomly select K time indices from the set of N Nyquist time indices. However, the first sampling rate is preferably uniform such that the K time indices are typically uniformly distributed throughout the set of N Nyquist indices.

As discussed above, the sampling performed by the sampling element 16 preferably corresponds to the output of the integrate/dump circuit 14. As discussed above, the integrated signal is preferably dumped at the same rate as the sampling rate utilizing the sampling rate.

For instance, assume N=16, a desired sampling rate of ¼ of N (K=4), and $\{T_{KT}\}$=4, 8, 12, 16. Utilizing a compressed sensing method lacking integration and dump, the resulting compressed sensing matrix could be:

$$\phi_{CONVENTIONAL} = \begin{pmatrix} 0 & 0 & 0 & 1 & 0 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 0 & 0 & 0 & 0 & 1 \end{pmatrix}$$

However, in embodiments of the present invention that employ integration and dump, it is desirable for the compressed sensing matrix to represent the integration period (D), which will be equal to K when the sampling rate for the integrate/dump circuit 14 and sampling element 16 are the same. Thus, for each time T listed in $\{T_{KT}\}$, the compressed sensing matrix represents the period T-D through T. For instance assuming N=16, K=4, $\{T_{KT}\}$=4, 8, 12, 16, a resulting exemplary compressed sensing matrix would be:

$$\phi_T = \begin{pmatrix} 1 & 1 & 1 & 1 & 0 & 0 & 0 & 0 & 0 & 0 & 0 & 0 & 0 & 0 & 0 & 0 \\ 0 & 0 & 0 & 0 & 1 & 1 & 1 & 1 & 0 & 0 & 0 & 0 & 0 & 0 & 0 & 0 \\ 0 & 0 & 0 & 0 & 0 & 0 & 0 & 0 & 1 & 1 & 1 & 1 & 0 & 0 & 0 & 0 \\ 0 & 0 & 0 & 0 & 0 & 0 & 0 & 0 & 0 & 0 & 0 & 0 & 1 & 1 & 1 & 1 \end{pmatrix}$$

In embodiments where the delay element 30 is used, the K time indices may be non-uniformly distributed across N. For instance, if two sampling elements 16 are used, where a second of the sampling elements 16 samples a delayed signal as shown in FIGS. 2-3, the resulting sampled data, and associated time indices, would not necessarily be uniformly distributed. For instance, as a second example, if N=16, K=4, $\{T_{KT}\}$=4, 5, 12, 13, a resulting exemplary compressed sensing matrix would be $$\phi_{T\text{-}DELAY} = \begin{pmatrix} 1 & 1 & 1 & 1 & 0 & 0 & 0 & 0 & 0 & 0 & 0 & 0 & 0 & 0 & 0 & 0 \\ 0 & 1 & 1 & 1 & 1 & 0 & 0 & 0 & 0 & 0 & 0 & 0 & 0 & 0 & 0 & 0 \\ 0 & 0 & 0 & 0 & 0 & 0 & 0 & 0 & 1 & 1 & 1 & 1 & 0 & 0 & 0 & 0 \\ 0 & 0 & 0 & 0 & 0 & 0 & 0 & 0 & 0 & 1 & 1 & 1 & 1 & 0 & 0 & 0 \end{pmatrix}$$

In the above example, a first sampling element would sample at $T_{KT}$=4 and 12 and a second sampling element would sample at $T_{KT}$=5 and 13, as is discussed in more detail below.

As should be appreciated by those skilled in the art, any combination of sampling and delay elements may be used to create any desired distribution of K within $T_{KT}$. As also should be appreciated by those skilled in the art, the above example matrices are not intended to accurately reflect actual matrices that may be used in practice, as for many signals, N may be much greater than 1000. Further, in some embodiments having the plurality of sampling elements 16, a plurality of clock signals may be used to achieve any desired sampling times or matrix configuration.

The formed compressed sensing matrix $\phi$ may be stored within the memory 20 for later use by the apparatus 10 as is discussed below in more detail. In some embodiments, a plurality of formed first compressed sensing matrices may be stored with the memory 20 to facilitate later use by the apparatus 10 and processor 18. For example, the processor 18 may form a plurality of first compressed sensing matrices corresponding to various or predictable combinations of K and N and store the formed first compressed sensing matrices as a database within the memory 20. Thus step 106, and the compressed sensing matrix formed therein, may be formed a priori, off-line, and independent of the other steps discussed herein.

In step 108, a measurement vector y is formed utilizing at least one of the samples acquired in step 104. Thus, the measurement vector y is formed by sampling the integrated signal at the first sampling rate discussed above in step 102. For example, the receiving element 12 may receive the input signal, the integrate/dump circuit 14 may integrate the received signal to provide the integrated signal, and the sampling element 16 may sample the integrated signal at the first sampling rate, as defined by the K time indices $\{T_{KT}\}$. Thus, for each time listed in $\{T_{KT}\}$, the integrated signal is sampled. Sampling of the integrated signal according to the K time indices Of $\{T_{KT}\}$ forms the measurement vector y as a K×1 vector. As the first sampling rate is substantially less than the Nyquist rate (K<<N), the present invention may easily sample high frequency signals.

In some embodiments, the measurement vector y may be formed by sampling the integrated signal with the sampling element 16 at the Nyquist rate and then discarding samples based upon the first sampling rate and $\{T_{KT}\}$. For instance, if sampling at the Nyquist rate results in 100 samples and K=20, 80 of the 100 samples may be randomly, arbitrarily, or uniformly discarded to form the measurement vector y.

In embodiments having the plurality of sampling elements 16, the measurement vector y is preferably formed utilizing samples corresponding to each sampling element 16. For instance, in the embodiment shown in FIG. 2 having two sampling elements 16, the measurement vector y is preferably formed utilizing samples from each of the sampling elements 16 such that for each time listed in $\{T_{KT}\}$, an integrated signal is sampled by one of the sampling elements 16.

For example, in the second example discussed above in step 106, N=16, K=4, $\{T_{KT}\}$=4, 5, 12, 13 In step 108, the measurement vector y would be formed by sampling at $T_{KT}$=4 with the first sampling element, sampling at $T_{KT}$=5 with the second sampling element, sampling at $T_{KT}$=12 with the first sampling element, and sampling at $T_{KT}$=13 with the second sampling element. Such a configuration enables the uniform first sampling rate to be employed in combination with the delay element 30 to generate non-uniform samples for the measurement vector y.

In step 110, the input signal is at least partially reconstructed utilizing the compressed sensing matrix $\phi$ and the measurement vector y. As utilized herein, "reconstructed" refers to any method of estimating, extrapolating, projecting, or reconstructing the input signal from the sampled integrated signal, such as by utilizing the measurement vector y or other representations of sampled signals, and the compressed sensing matrix $\phi$, to provide an estimation of the originally received input signal.

Preferably, a matrix-based compressed sensing reconstruction approach is employed to provide a full-bandwidth representation of at least a portion of the input signal at the Nyquist rate, without actually sampling at the Nyquist rate or storing all data corresponding to Nyquist rate sampling, by utilizing the compressed sensing matrix and the measurement vector y. Various matrix-based approaches are known in the art and any one of these approaches may be employed by embodiments of the present invention to reconstruct a signal utilizing the compressed sensing matrix $\phi$ and the measurement vector y. For instance, the commonly-used Atomizer and Wavelab MATLAB packages, distributed by Stanford University, are operable to perform signal reconstruction using basis pursuit optimization and cosine packet reconstruction.

More preferably, the input signal is at least partially reconstructed by solving a minimization to get the best input signal representation x that is consistent with the measurement vector y and the compressed sensing matrix $\phi$. Input signal reconstruction functions most appropriately when the input signal is has a sparse representation in some basis $\psi$.

For example, assume the input signal comprises a sparsely represented signal of interest and a non-sparsely represented noise signal.

Through utilization of steps 100-112, embodiments of the present invention are operable to accurately reconstruct a full bandwidth representation of the signal of interest at the Nyquist rate without actually sampling at the Nyquist rate. Additionally, steps 100-112 enable real-time signal reconstruction through use of the apparatus 10. Further, the non-sparsely represented noise signal is not reconstructed due to its non-sparse representation. Thus, the present invention is most accurate when the input signal does not include relevant data at all frequencies and sampled times.

One preferred reconstruction method is to reconstruct the input signal as follows:

$$\min_x \|\Psi^T x\|_1 \text{ subject to } \|y - \Phi x\|_2 < \varepsilon$$

The optimization utilized with the above criteria generally corresponds to a linearly constrained convex quadratic program that may be solved using various available techniques such as basis pursuit or modified basis pursuit (basis pursuit de-noising). The basis pursuit or modified basis pursuit methods employed by the present invention may be generally similar to the basis pursuit methods disclosed by Y. Tsaig and D. L. Donoho in their Oct. 22, 2004, paper entitled "Extensions of Compressed Sensing", which is incorporated herein by reference.

Another preferred reconstruction method is orthogonal matching pursuit. Various orthogonal matching pursuit methods that may be employed by the present invention are disclosed by J. A. Tropp and A. C. Gilbert in their Apr. 11, 2005, paper entitled "Signal Recovery From Partial Information Via Orthogonal Matching Pursuit" which is incorporated herein by reference. While the l2 norm may be minimized instead of the l1 norm, the reconstruction is more accurate in general if the l1 norm is minimized.

As should be appreciated by those skilled in the art, different reconstruction methods or frame elements may be used by the present invention depending on the appropriate signal class, apparatus 10 configuration, environmental configurations, etc.

By utilizing various reconstruction methods, the compressed sensing matrix φ, and the measurement vector y, embodiments of the present invention are operable to provide an accurate full-bandwidth representation of at least a portion of the input signal at the Nyquist rate, without actually requiring sampling at the Nyquist rate, particularly when in the input signal is sparsely represented in some basis.

Although the invention has been described with reference to the preferred embodiment illustrated in the attached drawing figures, it is noted that equivalents may be employed and substitutions made herein without departing from the scope of the invention as recited in the claims. For example, the present invention may be employed for resampling a previously Nyquist sampled signal that is sparsely represented in some basis. Specifically, the compressed sensing matrix φ may be utilized to resample the previously Nyquist sampled signal, x, to reduce computing resources, bandwidth, or storage capacity consumed by the Nyquist sampled signal.

Having thus described the preferred embodiment of the invention, what is claimed as new and desired to be protected by Letters Patent includes the following:

1. An apparatus for reconstructing an input signal, the apparatus comprising:
   a receiving element operable to receive the input signal;
   an integrate/dump circuit coupled with the receiving element, the integrate/dump circuit operable to integrate at least a portion of the received signal to provide an integrated signal and dump the integrated portion of the received signal,
   a sampling element coupled with the integrate/dump circuit, the sampling element operable to receive the integrated signal and sample the integrated signal at a first sampling rate to provide a sampled signal, the first sampling rate being less than the Nyquist rate for the input signal; and
   a processor coupled with the sampling element, the processor operable to
   form a compressed sensing matrix utilizing a first set of time indices corresponding to the first sampling rate,
   receive at least a portion of the sampled signal,
   form a measurement vector utilizing at least a portion of the sampled signal, and
   reconstruct at least a portion of the input signal utilizing the compressed sensing matrix and the measurement vector.

2. The apparatus of claim 1, wherein the integrate/dump circuit is operable to be dumped at the first sampling rate such that provided integrated signal represents an integration of the input signal over a period generally defined by the inverse of the frequency of the first sampling rate.

3. The apparatus of claim 1, wherein the integrate/dump circuit is operable to repeatedly integrate and dump the received input signal and the sampling element is operable to repeatedly sample the integrated signal.

4. The apparatus of claim 1, wherein the processor is operable to form a full-bandwidth representation of at least a portion of the input signal at the Nyquist rate.

5. The apparatus of claim 1, wherein the sampling element includes at least one analog-to-digital converter (ADC).

6. The apparatus of claim 1, further including a plurality of integrate/dump circuits each operable to integrate at least a portion of the input signal.

7. The apparatus of claim 6, further including a plurality of sampling elements operable to sample the output of each integrate/dump circuit.

8. The apparatus of claim 6, further including at least one delay element coupled with a second one of the integrate/dump circuits to delay the portion of the received signal integrated by the second integrate/dump circuit.

9. An apparatus for reconstructing an input signal, the apparatus comprising:
   a receiving element operable to receive the input signal;
   a first integrate/dump circuit coupled with the receiving element, the first integrate/dump circuit operable to integrate a least a portion of the received signal to provide a first integrated signal and dump the integrated portion of the received signal;
   a delay element coupled with the receiving element, the delay element operable to delay the received input signal to provide a delayed signal;
   a second integrate/dump circuit coupled with the delay element, the second integrate/dump circuit operable to integrate a least a portion of the delayed signal to provide a second integrated signal and dump the integrated portion of the delayed signal;

a first sampling element coupled with the first integrate/dump circuit, the first sampling element operable to receive the first integrated signal and sample the first integrated signal at a first sampling rate to provide a first sampled signal, the first sampling rate being less than the Nyquist rate for the input signal;

a second sampling element coupled with the second integrate/dump circuit, the second sampling element operable to receive the second integrated signal and sample the second integrated signal at the first sampling rate to provide a second sampled signal; and a processor coupled with the sampling elements, the processor operable to— form a compressed sensing matrix utilizing a first set of time indices corresponding to the first sampling rate, receive at least a portion of the first and second sampled signals, form a measurement vector utilizing at least a portion of the sampled signals, and reconstruct at least a portion of the input signal utilizing the compressed sensing matrix and the measurement vector.

10. The apparatus of claim 9, wherein the integrate/dump circuits are operable to be dumped at the first sampling rate such that provided integrated signals represent an integration of the input signal over a period generally defined by the inverse of the frequency of the first sampling rate.

11. The apparatus of claim 9, wherein the first integrate/dump circuit is operable to repeatedly integrate and dump the received input signal, the second integrate/dump circuit is operable to repeatedly integrate and dump the delayed signal, the first sampling element is operable to repeatedly sample the first integrated signal, and the second sampling element is operable to repeatedly sample the second integrated signal.

12. The apparatus of claim 9, wherein the processor is operable to form a full-bandwidth representation of at least a portion of the input signal at the Nyquist rate.

13. The apparatus of claim 9, wherein each sampling element includes at least one analog-to-digital converter (ADC).

14. A method for reconstructing an input signal, the method comprising:

receiving the input signal;

integrating at least a portion of the received input signal to provide a first integrated signal and dumping the integrated portion of the received signal;

sampling the integrated signal at a first sampling rate to provide a sampled signal, the first sampling rate being less than the Nyquist rate for the input signal;

forming a compressed sensing matrix utilizing a first set of time indices corresponding to the first sampling rate, forming a measurement vector utilizing at least a portion of the sampled signal; and reconstructing at least a portion of the input signal utilizing the compressed sensing matrix and the measurement vector.

15. The method of claim 14, wherein the integrated portion of the received signal is dumped at the first sampling rate such that provided integrated signal represents an integration of the input signal over a period generally defined by the inverse of the frequency of the first sampling rate.

16. The method of claim 14, wherein the received signal is repeatedly integrated and dumped and the integrated signal is repeatedly sampled.

17. The method of claim 14, wherein the input signal is reconstructed utilizing the combined compressed sensing matrix and the measurement vector to form a full-bandwidth representation of at least a portion of the input signal at the Nyquist rate.

* * * * *